(12) United States Patent
Dhindsa et al.

(10) Patent No.: US 6,887,340 B2
(45) Date of Patent: May 3, 2005

(54) ETCH RATE UNIFORMITY

(75) Inventors: Rajinder Dhindsa, San Jose, CA (US); Bobby Kadkhodayan, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 282 days.

(21) Appl. No.: 10/293,898

(22) Filed: Nov. 12, 2002

(65) Prior Publication Data

US 2003/0148611 A1 Aug. 7, 2003

Related U.S. Application Data

(60) Provisional application No. 60/338,034, filed on Nov. 13, 2001.

(51) Int. Cl.[7] ............................................. H01L 21/306
(52) U.S. Cl. .............................. 156/345.3; 156/345.35; 438/706; 438/731
(58) Field of Search ................................ 438/706, 707, 438/710, 716, 731; 216/58, 67, 68, 71; 156/345.3, 345.35, 345.39

(56) References Cited

U.S. PATENT DOCUMENTS

| | | | |
|---|---|---|---|
| 4,392,932 A | 7/1983 | Harra | 204/192 |
| 4,632,719 A | 12/1986 | Chow et al. | 156/345 |
| 4,954,201 A | 9/1990 | Latz et al. | 156/345 |
| 5,292,399 A | 3/1994 | Lee et al. | 156/643 |
| 5,534,751 A | 7/1996 | Lenz et al. | 315/111.71 |
| 5,942,042 A | 8/1999 | Gogh | 118/728 |
| 5,998,932 A | 12/1999 | Lenz | 315/111.21 |
| 6,051,073 A * | 4/2000 | Chu et al. | 438/766 |
| 6,074,488 A | 6/2000 | Roderick et al. | 118/728 |
| 6,178,919 B1 | 1/2001 | Li et al. | 118/723 |
| 6,241,477 B1 * | 6/2001 | Brezoczky et al. | 417/48 |
| 6,413,382 B1 * | 7/2002 | Wang et al. | 204/192.12 |
| 6,553,277 B1 * | 4/2003 | Yagisawa et al. | 700/204 |

FOREIGN PATENT DOCUMENTS

| | | | |
|---|---|---|---|
| EP | 0 660 499 | 12/1993 | H02N/13/00 |
| EP | 0 665 575 | 2/1994 | H01J/37/34 |
| WO | WO-99/14788 | 9/1997 | H01J/37/32 |

OTHER PUBLICATIONS

PCT International Search Report, PCT/US 02/36557 International filing date Nov. 13, 2002, date Search Report mailed Apr. 8, 2003.

* cited by examiner

*Primary Examiner*—Lan Vinh
(74) *Attorney, Agent, or Firm*—Thelen Reid & Priest LLP; Thierry K. Lo

(57) ABSTRACT

An etching apparatus has a chamber enclosing a first electrode, a second electrode, confinement rings, a focus ring, and a shield. The first electrode is coupled to a source of a fixed potential. The second electrode is coupled to a dual frequency RF power source. The confinement rings are disposed between the first electrode and the second electrode. The chamber is formed of an electrically conductive material coupled to the source. The focus ring substantially encircles the second electrode and electrically insulates the second electrode. The shield substantially encircles the focus ring. The distance between an edge of the second electrode and an edge of the shield is at least less than the distance between the edge of the second electrode and an edge of the first electrode. The shield is formed of an electrically conductive material coupled to the source of fixed potential.

9 Claims, 4 Drawing Sheets

ETCH RATE UNIFORMITY

CROSS-REFERENCE TO RELATED APPLICATION

This application claims the benefit of provisional U.S. Patent Application Ser. No. 60/338,034 filed on Nov. 13, 2001 in the names of the same inventors.

FIELD OF THE INVENTION

The present invention relates to substrate supports. More particularly, the present invention relates to a method and apparatus for achieving uniform plasma distribution above a substrate during plasma processing.

BACKGROUND OF THE INVENTION

A typical plasma etching apparatus comprises a reactor in which there is a chamber through which reactive gas or gases flow. Within the chamber, the gases are ionized into a plasma, typically by radio frequency energy. The highly reactive ions of the plasma gas are able to react with material, such as a polymer mask on a surface of a semiconductor wafer being processed into Integrated Circuits (IC's ). Prior to etching, the wafer is placed in the chamber and held in proper position by a chuck or holder which exposes a top surface of the wafer to the plasma gas. There are several types of chucks known in the art. The chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer. The present invention is applicable to both types of chucks.

In semiconductor processing, the etch or deposition rate uniformity across the wafer during each process directly affects the device yield. This has become one of the main qualifying requirements for a process reactor and hence is considered a very important parameter during its design and development. With each increase in the size of wafer diameter, the problem of ensuring uniformity of each batch of ICs from larger and larger wafers becomes more difficult. For instance, with the increase from 200 mm to 300 mm in wafer size and smaller size per wafer, the edge exclusion shrinks to, for example, 2 mm. Thus maintaining uniform etch rate, profile, and critical dimensions all the way up to 2 mm from the edge of the wafer has become very important.

In a plasma etch reactor, the uniformity of etch parameters' (etch rate, profile, CD, etc.) is affected by several parameters. Maintaining uniform plasma discharge and hence plasma chemistry above the wafer has become very critical to improve the uniformity. Many attempts have been conceived to improve the uniformity of the wafer by manipulating the gas flow injection through the showerhead, modifying the design of the showerhead, and placing edge rings around the wafer.

The problem in a capacitively-coupled etching reactor having electrodes of different sizes is the lack of uniform RF coupling especially around the edge of a wafer. FIG. 1 illustrates a conventional capacitively-coupled plasma processing chamber 100, representing an exemplary plasma processing chamber of the types typically employed to etch a substrate. Referring now to FIG. 1, a chuck 102, representing the workpiece holder on which a substrate, such as a wafer 104, is positioned during etching. The chuck 102 may be implemented by any suitable chucking technique, e.g., electrostatic, mechanical, clamping, vacuum, or the like. During etching, the chuck 102 is typically supplied with dual RF frequencies (a low frequency and high frequency), for example 2 Mhz and 27 Mhz, simultaneously during etching by a dual frequency source 106.

An upper electrode 108 is located above the wafer 104. The upper electrode 108 is grounded. FIG. 1 illustrates an etching reactor where the surface of the upper electrode 108 is larger than the surface of the chuck 102 and the wafer 104. During etching, plasma 110 is formed from etchant source gas supplied via a gas line 112 and pumped out through an exhaust line 114. An electrical insulator ring 109 insulates the upper electrode 108 from the grounded chamber 100.

Confinement rings 116 may be placed between the upper electrode 108 and a bottom electrode, such as the chuck 102 in FIG. 1. In general, confinement rings 116 help confine the etching plasma 110 to the region above the wafer 104 to improve process control and to ensure repeatability.

When RF power is supplied to chuck 102 from RF power source 106, equipotential field lines are set up over wafer 104. The equipotential field lines are the electric field lines across the plasma sheath that is between wafer 104 and the plasma 110. During plasma processing, the positive ions accelerate across the equipotential field lines to impinge on the surface of wafer 104, thereby providing the desired etch effect, such as improving etch directionality. Due to the geometry of the upper electrode 108 and the chuck 102, the field lines may not be uniform across the wafer surface and may vary significantly at the edge of the wafer 104. Accordingly, a focus ring 118 is typically provided to improve process uniformity across the entire wafer surface. With reference to FIG. 1, wafer 104 is shown disposed within a focus ring 118, which may be formed of a suitable dielectric material such as ceramic, quartz, plastic, or the like. Thus the presence of the focus ring 118 allows the equipotential field lines to be disposed substantially uniformly over the entire surface of the wafer 104.

An electrically conductive shield 120 substantially encircles the focus ring 118. The electrically conductive shield 120 is configured to be substantially grounded within the plasma processing chamber. The shield 120 prevents the presence of unwanted equipotential field lines outside of focus ring 118.

Because the upper electrode 108 is larger than the bottom electrode 104, the path traveled by the RF current between the wafer 104 and the top electrode 108 increases especially at the edge of the wafer 104. Thus, the etch rate on the wafer 104 drops at the outer edge of the wafer 104 resulting in a less uniformly etched wafer.

Accordingly, a need exists for a method and apparatus for improving the plasma discharge uniformity above the wafer. A primary purpose of the present invention is to solve these needs and provide further, related advantages.

BRIEF DESCRIPTION OF THE INVENTION

An etching apparatus has a chamber enclosing a first electrode, a second electrode, confinement rings, a focus ring, and a shield. The first electrode is coupled to a source of a fixed potential. The second electrode is coupled to a dual frequency RF power source. The confinement rings are disposed between the first electrode and the second electrode. The chamber is formed of an electrically conductive material coupled to the source. The focus ring substantially encircles the second electrode and electrically the second electrode. The shield substantially encircles the focus ring. The distance between an edge of the second electrode and an edge of the shield is at least less than the distance between the edge of the second electrode and an edge of the first electrode. The shield is formed of an electrically conductive material coupled to the source of fixed potential.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of an etch rate uniformity improvement in a dual frequency plasma etch reactor. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
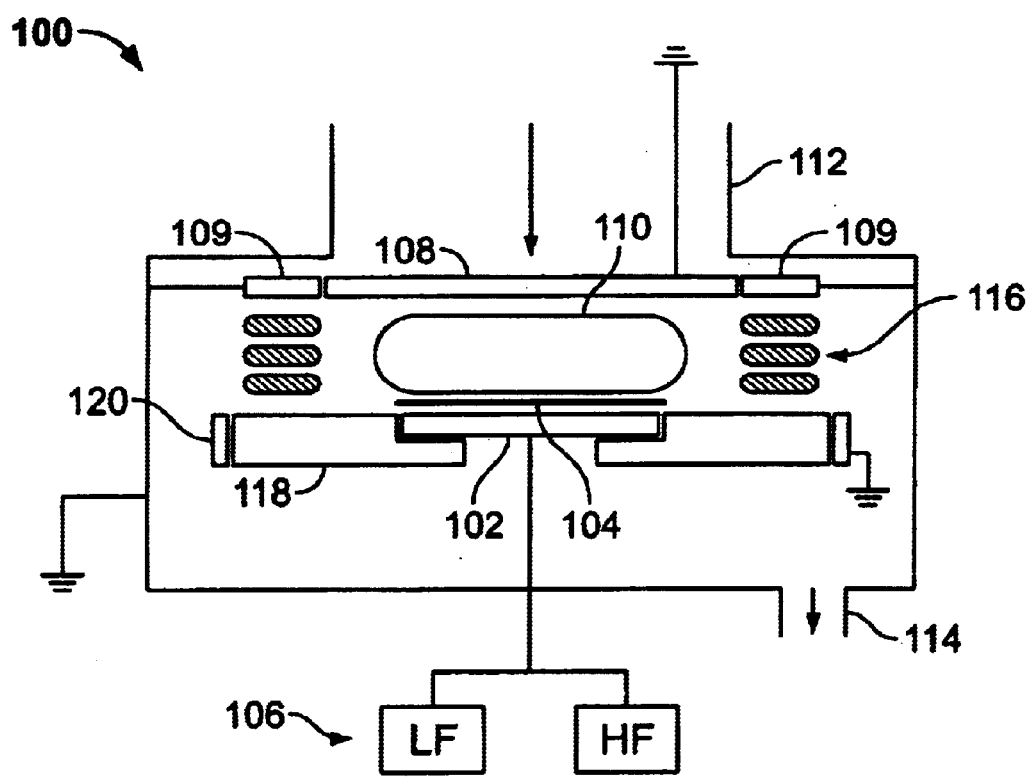
FIG. 1 is a schematic diagram of an etching apparatus in accordance to a prior art.
Figure 2:
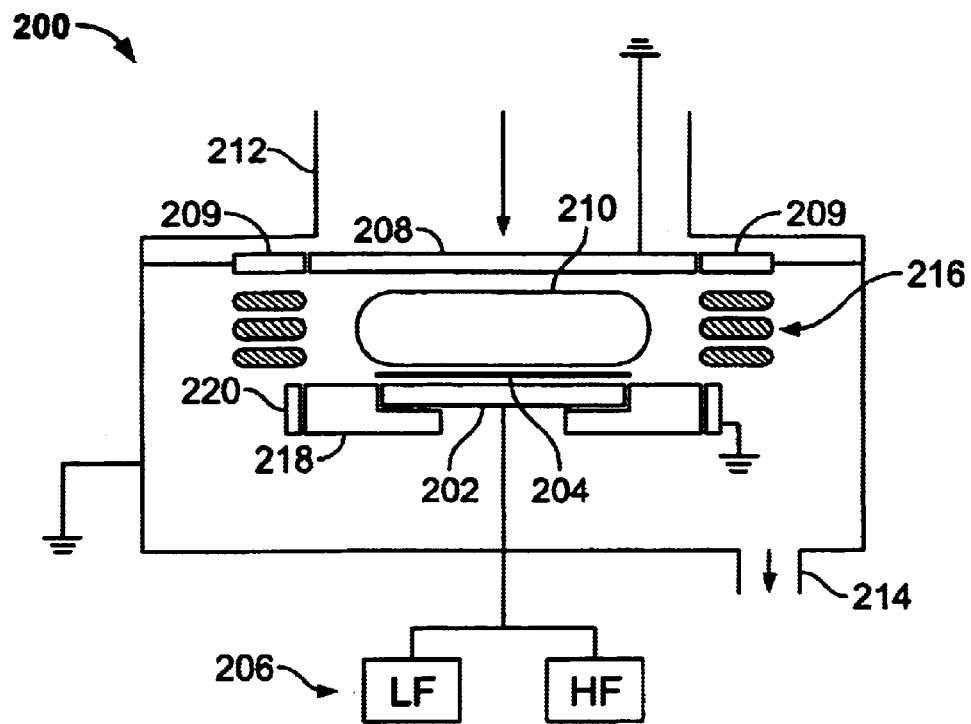
FIG. 2 is a schematic diagram of an etching apparatus in accordance with a specific embodiment of the present invention.

FIG. 2 illustrates a capacitively-coupled plasma processing chamber 200, representing an exemplary plasma processing chamber of the types typically employed to etch a substrate. Referring now to FIG. 2, a chuck 202, representing the workpiece holder on which a substrate, such as a wafer 204, is positioned during etching. The chuck 202 may be implemented by any suitable chucking technique, e.g., electrostatic, mechanical, clamping, vacuum, or the like. During etching, the chuck 202 is typically supplied with dual RF frequencies, for example 2 Mhz and 27 Mhz, simultaneously during etching by a dual frequency source 206.

An upper electrode 208 is located above the wafer 204. The upper electrode 208 may be grounded (as in the case of FIG. 2) or may be powered by another RF power source during etching. If the upper electrode 208 is powered, it may be insulated from the remainder of the reactor to isolate the upper electrode 208 from ground. FIG. 2 illustrates an etching reactor where the surface of the upper electrode 208 is larger than the surface of the chuck 202. During etching, plasma 210 is formed from etchant source gas supplied via a gas line 212 and pumped out through an exhaust line 214. An electrical insulator ring 209 insulates the upper electrode 208 from the grounded chamber 200.

Confinement rings 216 may be placed between the upper electrode 208 and a bottom electrode, such as the chuck 202 in FIG. 2. In general, confinement rings 216 help confine the etching plasma 210 to the region above the wafer 204 to improve process control and to ensure repeatability. Although only three confinement rings 216 are shown in the example of FIG. 2, it should be understood that any number of confinement rings may be provided.

When RF power is supplied to chuck 202 from dual RF power source 206, equipotential field lines (electric field lines across the plasma sheath which is between wafer 204 and the plasma 210) are set up over wafer 204. During plasma processing, the positive ions accelerate across the equipotential field lines to impinge on the surface of wafer 204, thereby providing the desired etch effect, such as improving etch directionality. Due to the geometry of the upper electrode 208 and the chuck 202, the field lines may not be uniform across the wafer surface and may vary significantly at the edge of the wafer 204. Accordingly, a focus ring 218 is typically provided to improve process uniformity across the entire wafer surface. With reference to FIG. 2, wafer 204 is shown disposed within a focus ring 218, which may be formed of a suitable dielectric material such as ceramic, quartz, plastic, or the like. Thus, by substantially encircling the wafer 204 and the chuck 202 with the focus ring 218, the equipotential field lines are disposed substantially uniformly over the entire surface of the wafer 204.

An electrically conductive shield 220 substantially encircles the focus ring 218. The electrically conductive shield 220 is configured to be substantially grounded within the plasma processing chamber. The shield 220 prevents the presence of unwanted equipotential field lines outside of focus ring 218 and provides desired directionality of the equipotential field lines.

To enhance the RF coupling around the wafer edge, and thereby improve the wafer edge uniformity, the ground return provided by the shield 220 is brought closer to the edge of wafer 204 and thus the outer edge of the chuck 202, such that the distance between the edge of the chuck 202 and the edge of the shield 220 is at least less than the distance between the edge of the upper electrode 208 and the edge of the chuck 202. Thus, the shield 220 provides a preferred ground return path for the current out of the edge of the chuck 202 and wafer 204.

Figure 3:
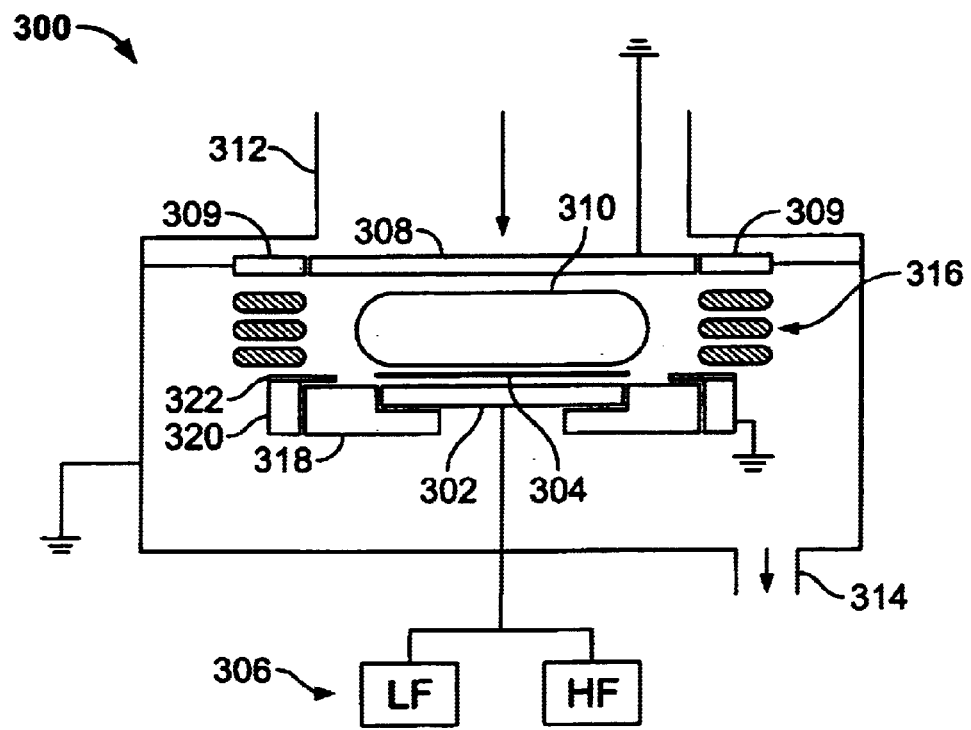
FIG. 3 is a schematic diagram of an etching apparatus in accordance with another specific embodiment of the present invention.

FIG. 3 illustrates another embodiment of a capacitively-coupled plasma processing chamber 300. Referring now to FIG. 3, a chuck 302, representing the workpiece holder on which a substrate, such as a wafer 304, is positioned during etching. The chuck 302 may be implemented by any suitable chucking technique, e.g., electrostatic, mechanical, clamping, vacuum, or the like. During etching, the chuck 302 is typically supplied with dual RF frequencies, for example 2 Mhz and 27 Mhz, simultaneously during etching by a dual frequency source 306.

An upper electrode 308 is located above the wafer 304. The upper electrode 308 may be grounded as in the case of FIG. 3. FIG. 3 illustrates an etching reactor where the surface of the upper electrode 308 is larger than the surface of the chuck 302. During etching, plasma 310 is formed from etchant source gas supplied via a gas line 312 and pumped out through an exhaust line 314. An electrical insulator ring 309 insulates the upper electrode 308 from the grounded chamber 300.

Confinement rings 316 may be placed between the upper electrode 308 and a bottom electrode, such as the chuck 302 in FIG. 3. In general, confinement rings 316 help confine the etching plasma 310 to the region above the wafer 304 to improve process control and to ensure repeatability. Although only three confinement rings 316 are shown in the example of FIG. 3, it should be understood that any number of confinement rings may be provided.

When RF power is supplied to chuck 302 from RF power source 306, equipotential field lines are set up over wafer 304. During plasma processing, the positive ions accelerate across the equipotential field lines to impinge on the surface of wafer 304, thereby providing the desired etch effect, such as improving etch directionality. Due to the geometry of the upper electrode 308 and the chuck 302, the field lines may not be uniform across the wafer surface and may vary significantly at the edge of the wafer 304. Accordingly, a focus ring 318 is typically provided to improve process uniformity across the entire wafer surface. With reference to FIG. 3, wafer 304 is shown disposed within a focus ring 318, which may be formed of a suitable dielectric material such as ceramic, quartz, plastic, or the like. Thus, the presence of the focus ring 318 allows the equipotential field lines to be disposed substantially uniformly over the entire surface of the wafer 304.

An electrically conductive shield 320 substantially encircles the focus ring 318. The electrically conductive shield 320 is configured to be substantially grounded within the plasma processing chamber. The shield 320 prevents the presence of unwanted equipotential field lines outside of focus ring 318.

To enhance the RF coupling around the wafer edge, and thereby improve the wafer edge uniformity, the ground return path provided by the shield 320 is brought closer to the wafer edge and spaced with the dielectric focus ring 318 as illustrated in FIG. 3. The shield 320 may, for example, be in the shape of a tube substantially encircling the focus ring 318. The electrically conductive shield 320 may include, for example, aluminum. In order to bring the electrically conductive shield 320 closer to the edge of the wafer 304, the shield 320 may be coated with a layer of silicon 322. The layer of silicon coating 322 may also partially extend and coat over the dielectric focus ring 318 as shown in FIG. 3. The distance between the inner edge of the silicon coat 322 and the edge of the wafer 304 is at least less than the distance between the edge of the upper electrode 308 and the edge of the chuck 302. The dielectric focus ring 318 electrically insulates the wafer and the silicon coat 322.

Figure 4:
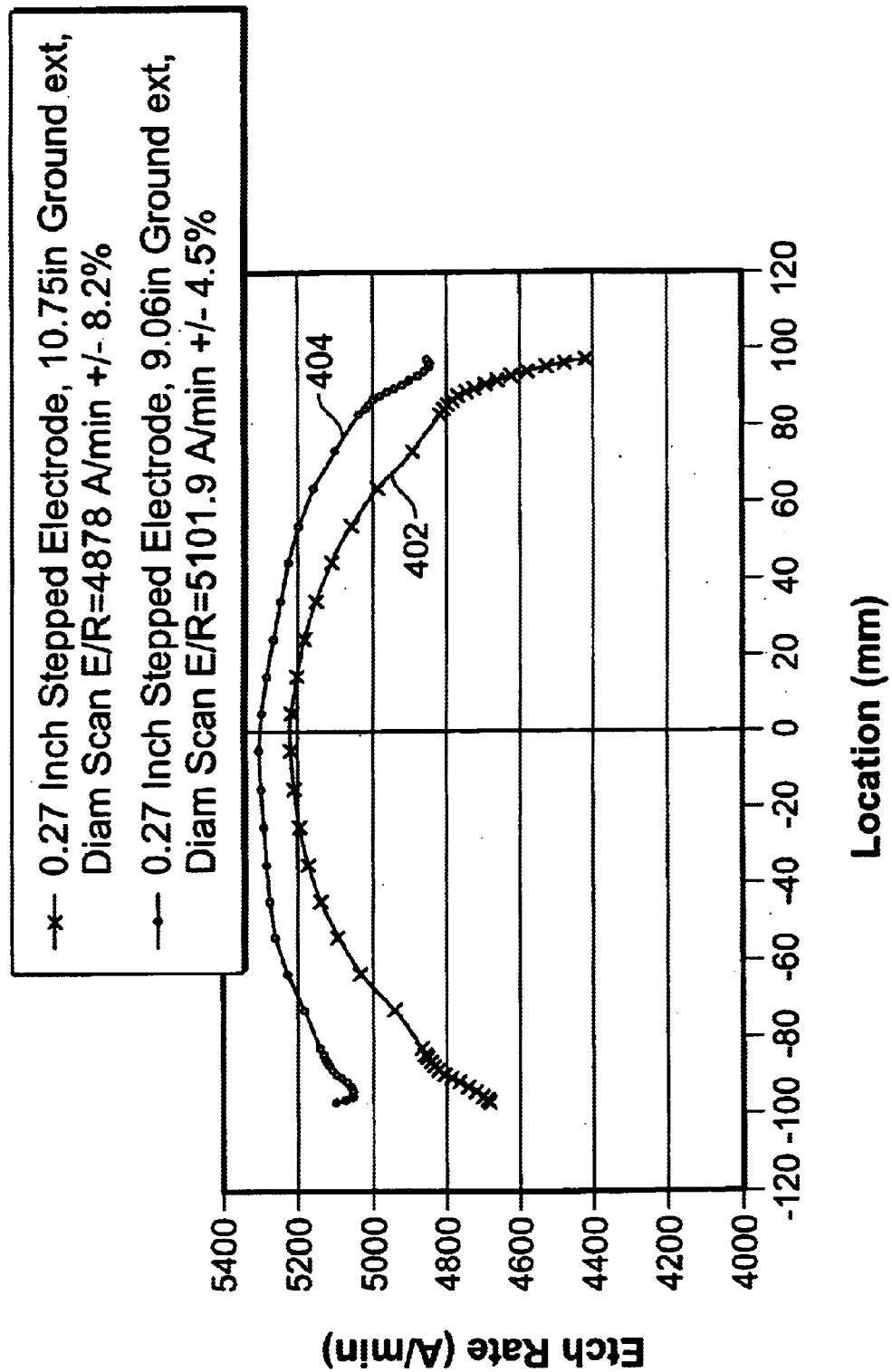
FIG. 4 is a graph comparing etch rates achieved in accordance with the prior art with etch rates achieved in accordance with one embodiment of the present invention.

FIG. 4 is a graph comparing etch rates achieved in accordance with the prior art with etch rates achieved in accordance with the present invention. A 15 millimeter Quartz focus ring is used as an insulator between the edge of a wafer and the Silicon coated Aluminum ground shield. Tests generating the graph in FIG. 4 were conducted in a capacitively-coupled chamber with 1.35 cm gap between flat electrodes. Blanket Oxide wafers have been etched to check the uniformity. Plot line 402 was generated in a conventional plasma etch reactor in accordance with a prior art. Plot line 404 was generated in a plasma etch reactor using the presently-claimed configuration.

As illustrated in FIG. 4, etch rate uniformity improved significantly using the presently-claimed configuration over the conventional configuration. The graph of FIG. 4 thus illustrates a more uniform etch rate across the wafer, especially at the edge of the wafer, using the presently-claimed configuration yielding a more uniform processed wafer.

Figure 5:
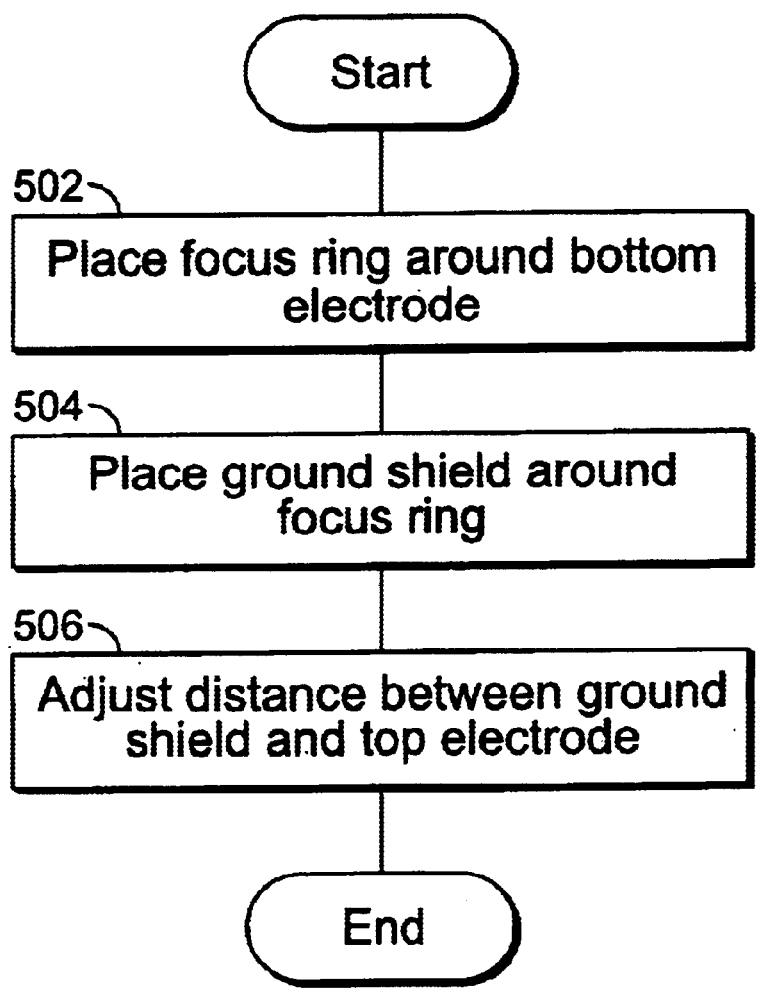
FIG. 5 is a flow diagram illustrating a method for improving etch rate uniformity in accordance with on embodiment of the present invention.

FIG. 5 illustrates a method for improving etch rate uniformity in a plasma etching apparatus having a top electrode and a bottom electrode in accordance with one embodiment of the present invention. At 502, an electrically insulating ring, or a focus ring, is placed around the edge of the bottom electrode. The bottom electrode may support a wafer and may be coupled to a dual frequency RF power source. At 504, a grounded shield is placed around the electrically insulating ring and substantially encircles both the electrically insulating ring and the bottom electrode. The distance between an edge of the bottom electrode or the wafer and an edge of the grounded shield is at least less than the distance between an edge of the bottom electrode or the wafer and an edge of the top electrode. In accordance with another embodiment of the present invention, the distance between the grounded shield and the top electrode may also be adjusted at 506. The etch rate uniformity across the wafer may be further optimized by adjusting the distance between the grounded shield and the top electrode at 506.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An etching apparatus comprising:
    a first electrode coupled to a source of a fixed potential;
    a second electrode coupled to a dual frequency RF power source;
    a plurality of confinement rings disposed between said first electrode and said second electrode;
    a chamber enclosing said first electrode, said second electrode, and said plurality of confinement rings, said chamber formed of an electrically conductive material coupled to said source of said fixed potential;
    a focus ring substantially encircling said second electrode and electrically insulating said second electrode; and
    a shield substantially encircling said focus ring, the distance between an edge of said second electrode and an edge of said shield being at least less than the distance between said edge of said second electrode and an edge of said first electrode, said shield formed of an electrically conductive material coupled to said source of said fixed potential.

2. The etching apparatus of claim 1 wherein said second electrode supports a wafer.

3. The etching apparatus of claim 1 wherein said focus ring includes quartz.

4. The etching apparatus of claim 1 wherein said shield includes aluminum.

5. The etching apparatus of claim 4 further comprising a silicon layer coated on said shield.

6. The etching apparatus of claim 5 wherein said silicon layer partially inwardly extends over said focus ring.

7. The etching apparatus of claim 1 wherein the surface of said first electrode is larger than the surface of said second electrode.

8. A method for improving etch rate uniformity in a plasma etching apparatus having a top electrode and a bottom electrode, the method comprising:

placing an electrically insulating ring around the edge of the bottom electrode coupled to a dual frequency RF power source; and placing a grounded shield around said electrically insulating ring, the distance between an edge of said bottom electrode and an edge of said grounded shield being at least less than the distance between an edge of said bottom electrode and an edge of the top electrode.

9. The method of claim 8 further comprising:

adjusting the distance between said edge of said grounded shield and said edge of the top electrode.

* * * * *

UNITED STATES PATENT AND TRADEMARK OFFICE
CERTIFICATE OF CORRECTION

PATENT NO. : 6,887,340 B2  Page 1 of 1
APPLICATION NO. : 10/293898
DATED : May 3, 2005
INVENTOR(S) : Dhindsa et al.

It is certified that error appears in the above-identified patent and that said Letters Patent is hereby corrected as shown below:

1) In column 2 line 65 after "encircles the second electrode and electrically," insert --insulates--.

Signed and Sealed this

Eighth Day of January, 2008

JON W. DUDAS
*Director of the United States Patent and Trademark Office*